(12) United States Patent
Hashimoto et al.

(10) Patent No.: US 7,796,002 B2
(45) Date of Patent: Sep. 14, 2010

(54) MAGNETIC FIELD GENERATOR FOR MRI

(75) Inventors: Shigeo Hashimoto, Saga (JP); Masaaki Aoki, Takatsuki (JP)

(73) Assignee: Hitachi Metals, Ltd., Tokyo (JP)

( * ) Notice: Subject to any disclaimer, the term of this patent is extended or adjusted under 35 U.S.C. 154(b) by 155 days.

(21) Appl. No.: 11/664,261

(22) PCT Filed: Sep. 30, 2004

(86) PCT No.: PCT/JP2004/014365

§ 371 (c)(1),
(2), (4) Date: Dec. 18, 2007

(87) PCT Pub. No.: WO2006/038261

PCT Pub. Date: Apr. 13, 2006

(65) Prior Publication Data

US 2008/0100406 A1   May 1, 2008

(51) Int. Cl.
*H01F 7/02* (2006.01)
(52) U.S. Cl. ............ 335/306; 335/296; 335/301; 335/302; 335/303; 310/152
(58) Field of Classification Search .......... 335/296, 335/301, 302, 303, 306; 310/152; 336/110, 336/218
See application file for complete search history.

(56) References Cited

U.S. PATENT DOCUMENTS

| | | | |
|---|---|---|---|
| 4,672,346 A * | 6/1987 | Miyamoto et al. | 335/296 |
| 4,679,022 A * | 7/1987 | Miyamoto et al. | 335/296 |
| 4,816,796 A | 3/1989 | Miyajima et al. | 335/306 |
| 5,283,544 A | 2/1994 | Sakurai et al. | 335/297 |
| 5,382,905 A * | 1/1995 | Miyata et al. | 324/319 |

(Continued)

FOREIGN PATENT DOCUMENTS

EP   0284439 A1   9/1988

(Continued)

OTHER PUBLICATIONS

Notification of Reason(s) for Refusal dated Jan. 15, 2008 to the corresponding Japanese Patent Application No. 2003-1628963 with English translation.

(Continued)

*Primary Examiner*—Elvin G Enad
*Assistant Examiner*—Mohamad A Musleh
(74) *Attorney, Agent, or Firm*—Kratz, Quintos & Hanson, LLP

(57) ABSTRACT

There is provided a magnetic field generator for MRI 10 applicable to a variety of magnetic field generators, and capable of preventing separation of permanent magnets 20 which constitute permanent magnet groups 14a, 14b. The magnetic field generator for MRI 10 includes a pair of permanent magnet groups 14a, 14b. The pair of permanent magnet groups 14a, 14b each including a plurality of permanent magnets 20 bonded to each other, are opposed to each other with a space in between. The permanent magnet groups 14a, 14b have projections 18 projecting more outward than the area of contact with respective pole pieces 16a, 16b. A flange-shaped member 34 is attached to each outer circumferential surface of the pole pieces 16a, 16b, covering a space-facing surface 18a of the projection 18.

6 Claims, 12 Drawing Sheets

U.S. PATENT DOCUMENTS

| | | | |
|---|---|---|---|
| 6,020,805 A * | 2/2000 | Børja Bjørn | 336/84 M |
| 6,333,630 B1 | 12/2001 | Holsinger et al. | 324/319 |
| 6,336,989 B1 | 1/2002 | Aoki et al. | 156/275.7 |
| 6,340,888 B1 * | 1/2002 | Aoki et al. | 324/319 |
| 6,452,472 B1 | 9/2002 | Aoki et al. | 335/296 |
| 6,642,826 B1 * | 11/2003 | Aoki et al. | 335/299 |
| 6,650,214 B2 | 11/2003 | Aoki et al. | 335/299 |
| 6,664,878 B1 | 12/2003 | Chen et al. | 335/296 |
| 6,784,776 B2 | 8/2004 | Aoki et al. | 335/299 |
| 6,794,973 B1 | 9/2004 | Aoki et al. | 335/299 |
| 6,897,751 B2 | 5/2005 | Aoki et al. | 335/296 |
| 7,065,860 B2 | 6/2006 | Aoki et al. | 29/607 |
| 7,143,507 B2 * | 12/2006 | Aoki et al. | 29/607 |
| 7,423,431 B2 * | 9/2008 | Amm et al. | 324/319 |
| 2005/0052266 A1 * | 3/2005 | Doi | 335/302 |
| 2006/0038648 A1 * | 2/2006 | Humphries et al. | 335/306 |
| 2006/0082035 A1 * | 4/2006 | Sugiyama et al. | 266/249 |

FOREIGN PATENT DOCUMENTS

| | | |
|---|---|---|
| EP | 0957369 A1 | 11/1999 |
| EP | 1102077 A2 | 5/2001 |
| JP | 60-71112 | 5/1985 |
| JP | 61-17053 | 1/1986 |
| JP | 61-152956 | 9/1986 |
| JP | 4-138132 | 5/1992 |
| JP | 6-224029 | 8/1994 |
| JP | 7-045425 | 2/1995 |
| JP | 8-339916 | 12/1996 |
| JP | 2699250 | 9/1997 |
| JP | 10-64721 | 3/1998 |
| JP | 10-275720 | 10/1998 |
| JP | 11-178808 | 7/1999 |
| JP | 2953659 | 7/1999 |
| JP | 2001-46351 | 2/2001 |
| JP | 2001-326118 | 11/2001 |
| JP | 2002-159467 | 6/2002 |
| JP | 2004-57829 | 2/2004 |
| WO | WO 94/20971 | 9/1994 |
| WO | WO99/52427 | 10/1999 |

OTHER PUBLICATIONS

International Search Report dated Nov. 9, 2004 along with (PCT/ISA/210, 220,237).

Notification of Reason(s) for Refusal dated May 7, 2008 to the corresponding Japanese Patent Application No. 2003-162863 with translation.

Japanese Office Communication (Questioning) dated Jan. 26, 2010 with its English translation.

Supplementary European Search Report dated Jun. 4, 2010.

* cited by examiner

F I G. 4
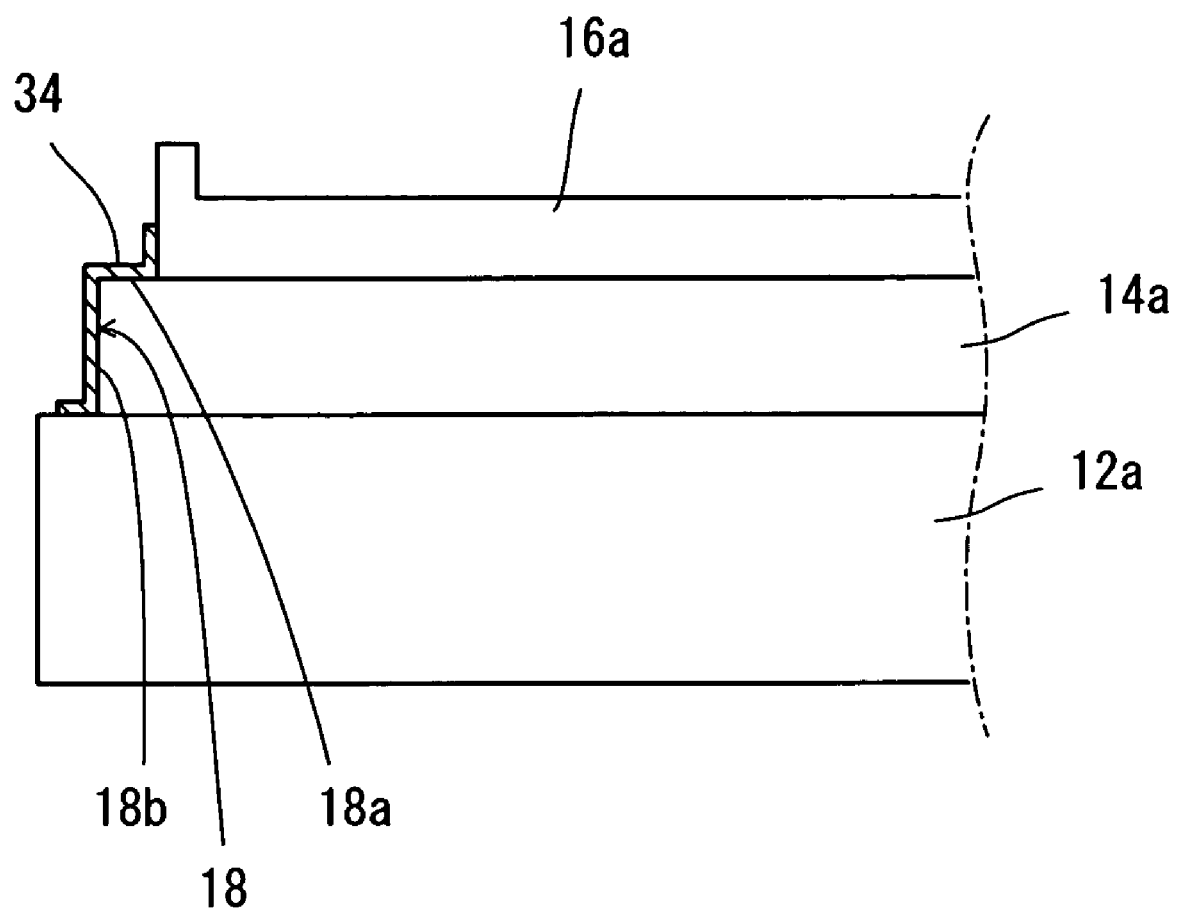

(a)

(b)

(a)

(b)

MAGNETIC FIELD GENERATOR FOR MRI

TECHNICAL FIELD

The present invention relates to magnetic field generators for MRI, and more specifically to a magnetic field generator for MRI which has a projection made by a permanent magnet group projecting more outward than a pole piece contacted therewith.

BACKGROUND ART

Conventionally, in a permanent magnet type magnetic field generator for MRI, permanent magnets which constitute a permanent magnet group are bonded to adjacent permanent magnets, a plate yoke or both of these, with adhesive.

However, such a construction may not be able to hold the permanent magnets which constitute the permanent magnet group sufficiently when the permanent magnet group is subjected to a mechanical load exceeding a normal design value due to vibration, impact, etc. during transportation of the magnetic field generator, and therefore can allow the permanent magnets to be separated from the adjacent permanent magnets or the plate yoke, or to detach from the permanent magnet group. In this case, it becomes impossible to keep magnetic field uniformity in the magnetic field generator for MRI, resulting in decreased magnetic field intensity.

Thus, proposals have been made for techniques of providing a formed material on a side surface of the permanent magnet group (See Patent Document 1 for example).

Also, proposals are made for techniques of using a magnet cover which protects the permanent magnet group (See Patent Document 2 for example).

Patent Document 1: JP Patent No. 2699250
Patent Document 2: JP-A 11-178808

DISCLOSURE OF THE INVENTION

Problems to be Solved by the Invention

According to the technique disclosed in JP Patent No. 2699250, the formed material holds the permanent magnets directly; therefore the technique has an advantage in preventing separation of the permanent magnets from adjacent permanent magnets or the plate yoke.

However, in order to provide such a formed material, it is necessary to first build a mold using a multiple members at a predetermined place of the plate yoke to define a closed space, then filling the space with the formed material, and then remove the mold. This requires a large number of steps.

In addition, the technique is applicable only to those magnetic field generators which have a space for disposing the mold around the permanent magnet group. The technique is not applicable to those magnetic field generators which do not have such a space; i.e. this is not a common technique which can be used on a variety of magnetic field generators.

According to the technique disclosed in JP-A 11-178808, it is possible to protect the permanent magnet group from external factors, using the magnet cover which is disposed to cover an outer circumferential surface of the permanent magnet group. However, there is a gap between the magnet cover and the permanent magnet group. Further, the magnet cover does not have a structure which holds the permanent magnet group directly. Therefore, it is not possible to prevent separation of the permanent magnets from other permanent magnets or the plate yoke, inside the magnet cover.

Therefore, a primary object of the present invention is to provide a magnetic field generator for MRI applicable to a variety of magnetic field generators, and capable of preventing the separation of permanent magnets which constitute the permanent magnet group.

Means for Solving the Problems

According to an aspect of the present invention, there is provided a magnetic field generator for MRI which includes: a pair of permanent magnet groups opposed to each other with a space in between, with each group including a plurality of permanent magnets bonded to each other; a yoke for magnetically connecting the pair of permanent magnet groups; and a pair of pole pieces provided on respective main surfaces of the permanent magnet groups. The permanent magnet group has a projection extending more outward than an area of contact with the pole piece. A magnetic field is generated in a space between the pole pieces.

The magnetic field generator is characterized by a permanent-magnet fixing member for preventing separation of the permanent magnets disposed in the projection, from the permanent magnet group.

According to the present invention, permanent-magnet fixing member enables to prevent separation of the permanent magnets which constitute a permanent magnet group, from adjacent permanent magnets or the plate yoke even if there is vibration, impact, etc., during transportation of the magnetic field generator for MRI. Specifically, it becomes possible to prevent the permanent magnets from detaching from the permanent magnet group, and to use the magnetic field generator for MRI stably for an extended period of time. Further, the permanent-magnet fixing member can be used not only in newly manufactured magnetic field generators but also in existing magnetic field generators, and can also be used suitably to reinforce magnetic field generators.

Preferably, the permanent-magnet fixing member is provided by a flange-shaped member attached to an outer circumferential surface of the pole piece to cover a space-side surface of the projection. If the permanent-magnet fixing member is provided by a flange-shaped member attached to an outer circumferential surface of the pole piece to cover the space-side surface of the projection as described, the flange-shaped member holds the permanent magnets on the space-facing surface even if an external impact, for example, has caused an excessive load to the bonded portion of the permanent magnets, and therefore it is possible to prevent separation of the permanent magnets. Also, attaching the flange-shaped member to the outer circumferential surface of the pole piece enables to use a permanent-magnet fixing member even if there is no space on the plate yoke where the permanent magnet group is disposed.

It should be noted here that the expression "to cover a space-side surface of the projection" does not only mean that the space-facing surface is covered in its entirety, but also mean that part of permanent magnet surfaces (surfaces constituting the space-facing surface) may be exposed.

Further preferably, the permanent-magnet fixing member is provided by a belt-shaped member attached to an outer circumferential surface of the projection. An advantage of using a belt-shaped member as the permanent-magnet fixing member is that the belt-shaped member can be attached easily to the outer circumferential surface of the projection in any magnetic field generator which has a projection whose outer circumferential surface is exposed.

Further, preferably, the magnetic field generator includes a reinforcing member provided between the belt-shaped member and the projection. If the outer circumferential surface of the projection has an uneven contour, fixing force of the belt-shaped member may not reach all of the permanent magnets. However, by placing the reinforcing member between the belt-shaped member and the projection of the permanent magnet group, it becomes possible to hold and fix all the permanent magnets which constitute the outer circumferential surface of the projection.

Preferably, the permanent-magnet fixing member is provided by a platy member for connecting a plurality of permanent magnets which constitute the projection. Using a platy member which connects a plurality of permanent magnets that constitute the projection, as a permanent-magnet fixing member as described, provides an advantage that the platy member can be attached easily to necessary places on the projection, enabling reinforcement in the fixation of the permanent magnets.

Further preferably, the platy member extends to the yoke and is fixed thereto. The platy member which extends to the yoke and is fixed thereto enables stronger connection between the permanent magnets and the yoke, and stronger fixation of the permanent magnets.

Further, preferably, the magnetic field generator includes a ring member surrounding the projection provided with the permanent-magnet fixing member. Further providing a ring member which surrounds the projection enables to prevent dropout of the permanent magnets from the magnetic field generator, and to protect the permanent magnet group from outside.

Preferably, the magnetic field generator further includes a formed material filled in a space between the ring member and the projection. Filling a formed material between the ring member and the projection enables to hold permanent magnets which constitute the projection of the permanent magnet group more strongly.

Further preferably, the permanent-magnet fixing member is provided by a cover member which follows a shape of the projection. Use of a cover member which follows the shape of the projection as a permanent-magnet fixing member enables to fix the outer circumferential surfaces of the permanent magnets which constitute the projection, and further the space-facing surface. The cover member can be manufactured more easily and is effective when the projection has a simpler shape.

BRIEF DESCRIPTION OF THE DRAWINGS

[FIG. 4] A schematic view showing a variation of the flange-shaped member.

FIG. 12(a) is a schematic view showing an example embodiment provided with a ring member, and FIG. 12(b) is a schematic view showing an example embodiment provided with the ring member filled with formed materials.

LEGEND

Figure 1:
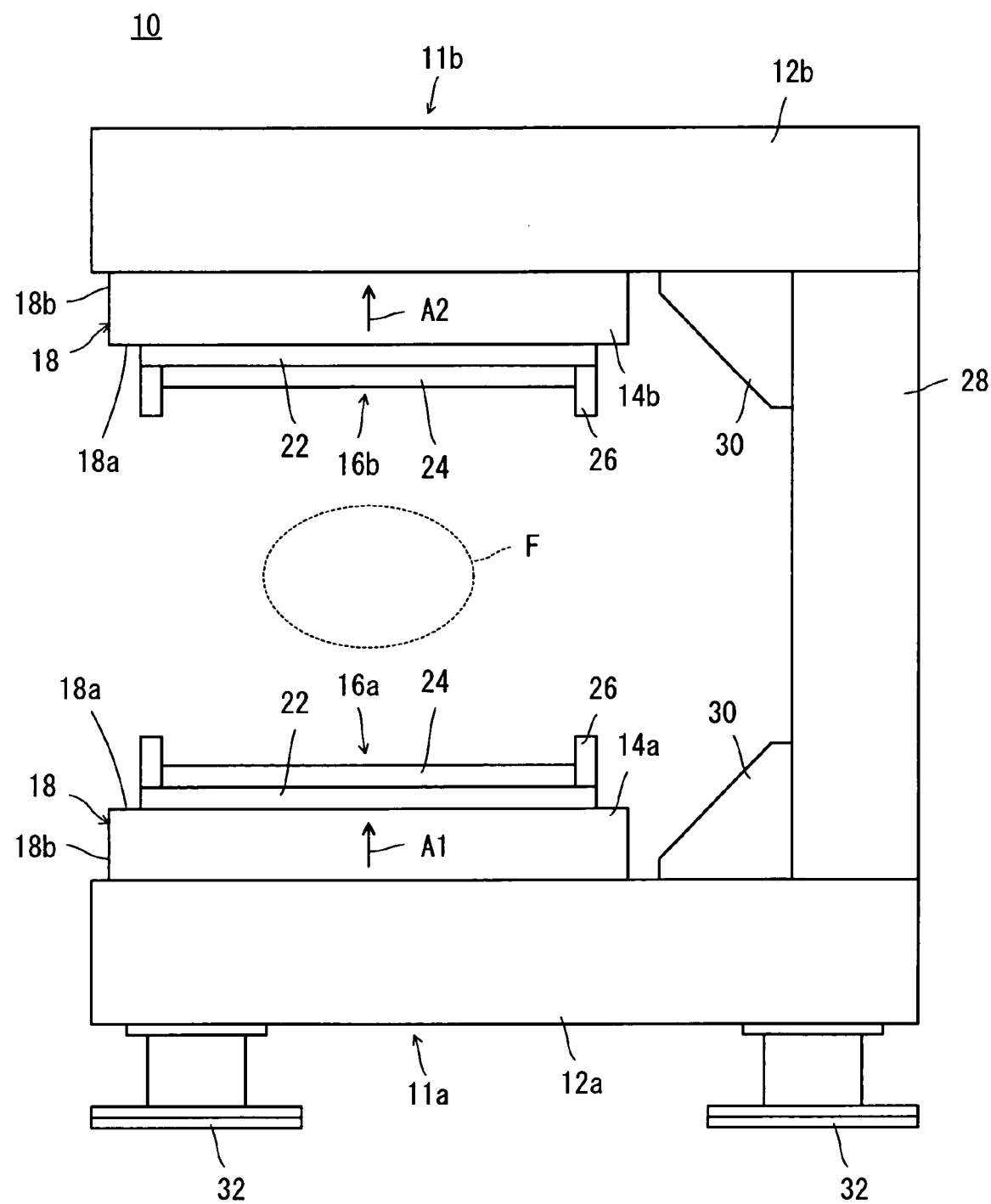
[FIG. 1] A schematic side view of a magnetic field generator for MRI to which the present invention is applied.

10 Magnetic field generator for MRI
11a, 11b Magnetic pole units
12a, 12b Plate yokes
14a, 14b Permanent magnet groups
16a, 16b Pole pieces
18 Projection
18a Space-side surface of projection
18b Outer circumferential surface of projection
20 Permanent magnet
28 Support yoke
34 Flange-shaped member
36 Belt-shaped member
38 Reinforcing member
40, 41 Cover members
42, 44 platy members
46 Ring member
48 Formed material

BEST MODE FOR CARRYING OUT THE INVENTION

Hereinafter, embodiments of the present invention will be described with reference to the drawings.

Referring to FIG. 1, a magnetic field generator for MRI 10 as an embodiment of the present invention is an open type magnetic field generator for an MRI apparatus, and includes a pair of magnetic pole units 11a and 11b opposed to each other with a space in between.

The magnetic pole units 11a and 11b include plate yokes 12a and 12b respectively. The pair of plate yokes 12a and 12b have opposed surfaces provided with permanent magnet groups 14a and 14b respectively. The permanent magnet groups 14a and 14b have opposed surfaces provided with pole pieces 16a and 16b fixed thereto respectively.

In this constitution, an outer circumferential portion of the permanent magnet group 14a extends more outward than the area of contact with the pole piece 16a, to become a projection 18, while an outer circumferential portion of the permanent magnet group 14b extends more outward than the area of contact with the pole piece 16b, to become a projection 18.

Figure 2:
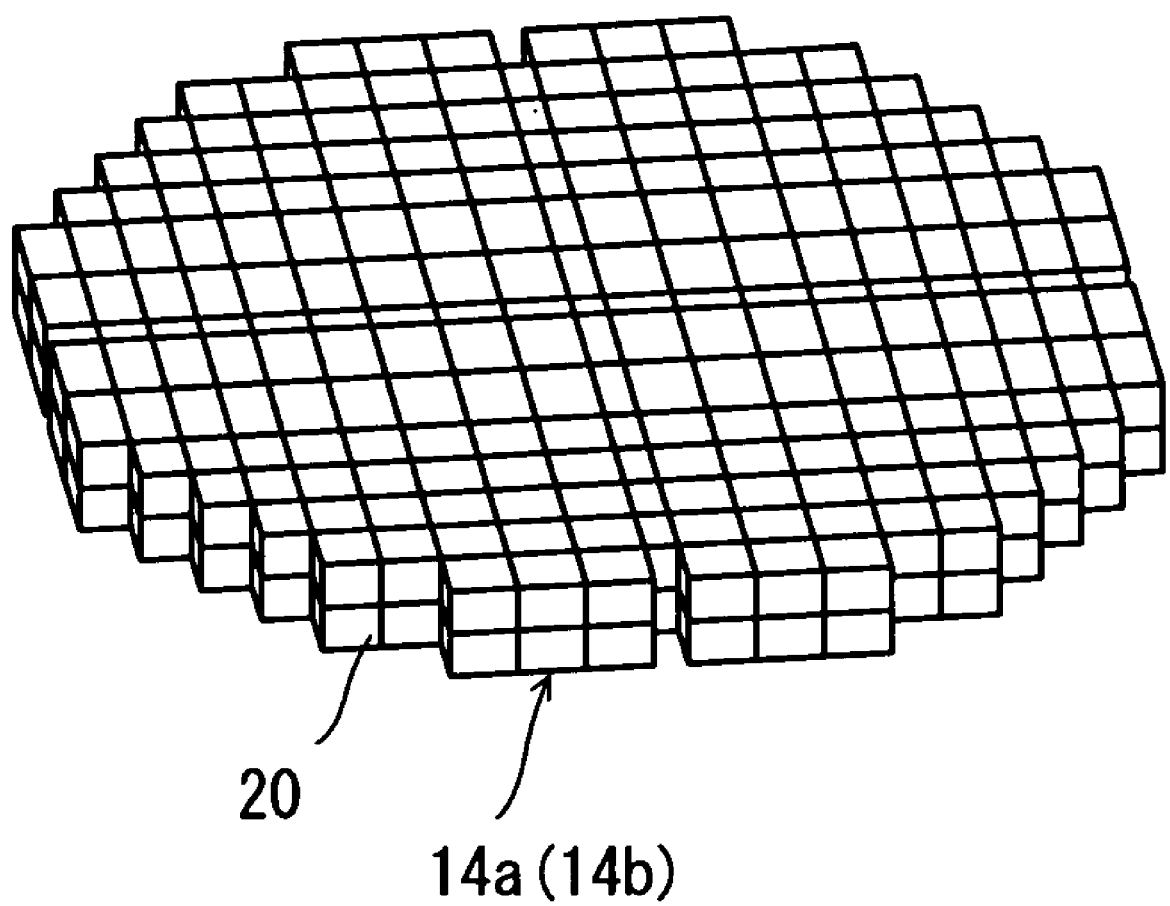
[FIG. 2] A perspective view showing an example of permanent magnet group.

The permanent magnet groups 14a and 14b have a height of 100 mm for example. As shown in FIG. 2, the permanent magnet groups 14a and 14b are made of a plurality of cubic or rectangular parallelepiped permanent magnets 20 bonded together into one-piece components. In the permanent magnet group 14a, all permanent magnets 20 are disposed in the same direction of magnetization, and in the permanent magnet group 14b, all permanent magnet 20 are disposed in the same direction of magnetization. In this embodiment, the permanent magnets 20 in the permanent magnet group 14a have their N poles facing the space, while the permanent magnets 20 in the permanent magnet group 14b have their S poles facing the space.

The permanent magnets 20 are provided by a high magnetic flux density type R—Fe—B magnet such as NEOMAX-47 (manufactured by NEOMAX Co., Ltd.) The permanent magnets 20 are obtained by assembling unillustrated unit magnets.

The pole piece 16a includes a disc-shaped base plate 22 which is made of iron for example and disposed on the permanent magnet group 14a. On the base plate 22, silicon steel plates 24 are formed to prevent generation of eddy current. The silicon steel plates 24 are fixed on the base plate 22 with adhesive. The base plate 22 has a circumferential edge portion formed with an annular projection 26 made of iron for example, for increased magnetic field intensity around the edge to obtain a uniform magnetic field. The annular projection 26 includes a plurality of annular projection pieces for example; and the annular projection 26 is formed by fixing each of the annular projection pieces around the circumferential edge portion of the silicon steel plates 24.

The plate yokes 12a and 12b are magnetically connected by a platy support yoke 28. Specifically, the support yoke 28 is connected with the plate yokes 12a and 12b, so that a lower end surface of the support yoke 28 meets an end portion of an upper surface of the plate yoke 12a whereas an upper end surface of the support yoke 28 meets an end portion of a lower surface of the plate yoke 12b. Therefore, each of the plate yokes 12a and 12b is connected with the support yoke 28 at an approximately 90 degree angle, to form an angular U shape when viewed from a side.

Figure 3:
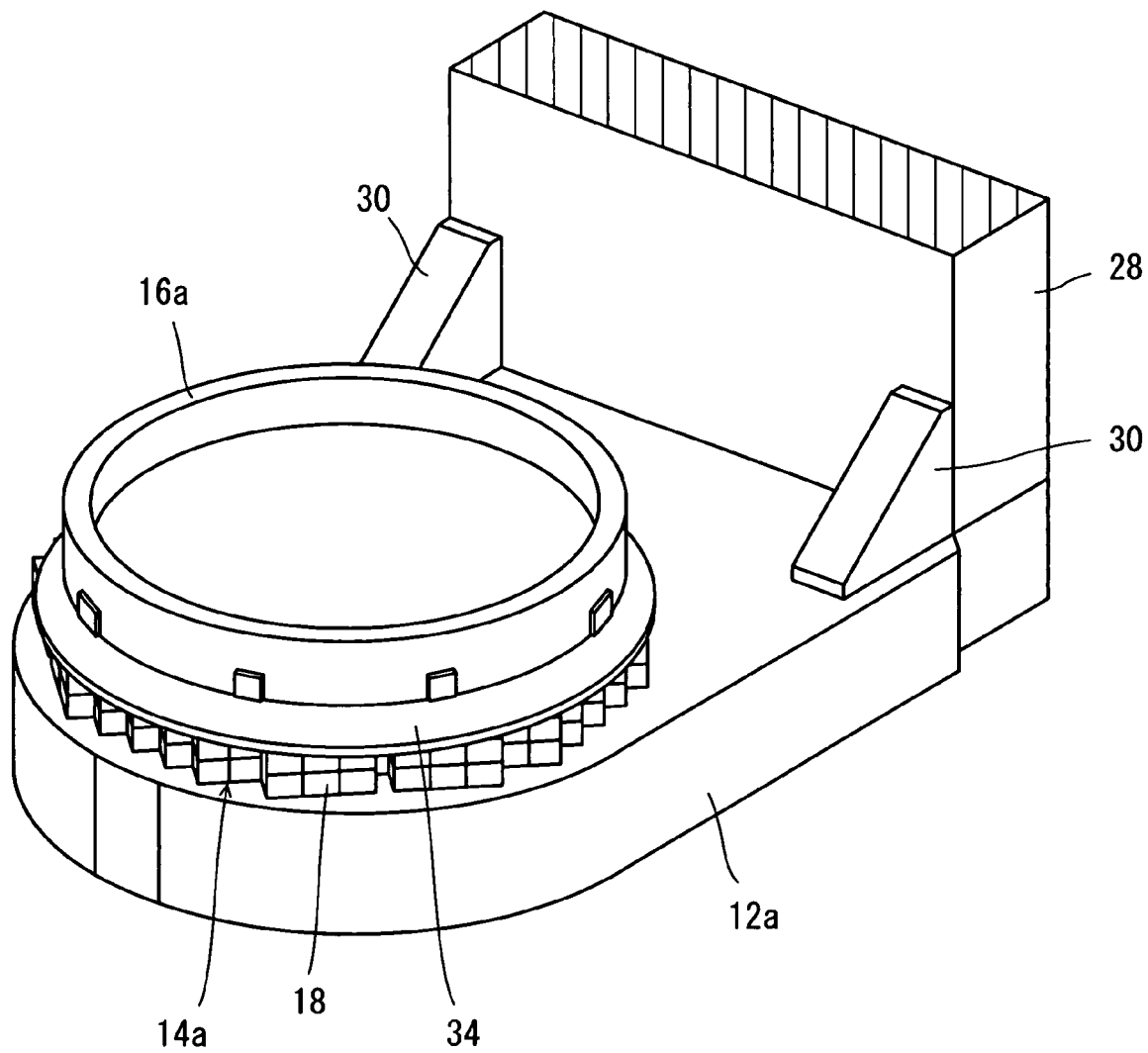
[FIG. 3] A partial perspective view showing an example embodiment provided with a flange-shaped member.

Referring also to FIG. 3, reinforcing members 30 are formed on an inner surface made by connection between the plate yoke 12a and the support yoke 28, at the farthest places therein from the permanent magnet group 14a (i.e. at both ends of the inner surface area made by the connection between the plate yoke 12a and the support yoke 28, according to the present embodiment). Likewise, reinforcing members 30 are formed on an inner surface made by connection between the plate yoke 12b and the support yoke 28, at the farthest places therein from the permanent magnet group 14b (i.e. at both ends of the inner surface area made by the connection between the plate yoke 12b and the support yoke 28, according to the present embodiment). Therefore, the plate yoke 12a and the support yoke 28, as well as the plate yoke 12b and the support yoke 28 are fixed with each other more strongly by the reinforcing members 30.

The plate yoke 12a has a lower surface provided with four legs 32.

In the magnetic field generator 10 as described, a magnetic field is generated in a space between the pole pieces 16a and 16b, and it is required that a magnetic field intensity in a uniform magnetic field space F (See FIG. 1) is not lower than 0.2 T for example.

The magnetic field generator 10 as described includes a flange-shaped member 34 as shown in FIG. 3 as a permanent-magnet fixing member.

It should be noted here that FIG. 3, FIG. 5, FIG. 7, FIG. 9 and FIG. 11 give no depiction on the side of magnetic pole units 11b; obviously however, the structure has an up-down symmetry as in the magnetic field generator 10 shown in FIG. 1. The permanent magnet group 14a is disposed so that the direction of magnetization of its permanent magnets 20 is A1 while the permanent magnet group 14b is disposed so that the direction of magnetization of its permanent magnets 20 is A2.

As shown in FIG. 3, the flange-shaped member 34 is attached to the outer circumferential surface of the pole piece 16a like a brim, and the space-facing surface 18a of the projection 18 (See FIG. 1) is covered by the flange-shaped member 34. At a time of assembling, a procedure may be that the pole piece 16a is first assembled onto the permanent magnet group 14a, and then the flange-shaped member 34 is attached to the outer circumferential surface of the pole piece 16a, by welding for example. The same applies to arrangements for the magnetic pole unit 11b.

The flange-shaped member 34 is preferably provided by a nonmagnetic metal such as aluminum and stainless steel which has a thickness of 3 mm through 10 mm approx. Such a nonmagnetic metal has superior strength yet does not affect the magnetic field generated in the magnetic field generator 10. If eddy current prevention has a priority, the flange-shaped member 34 made of the nonmagnetic metal may be divided into a plurality of pieces, and a material which has a high electric resistance is disposed or a gap is formed, between each piece of the flange-shaped member and the pole piece 16a, as well as between mutually adjacent pieces of the flange-shaped member, for electrical insulation. Also preferably, the flange-shaped member 34 is made of a material which has a high electric resistance such as resin and ceramic. A reinforcing member 38, cover members 40, 41, platy members 42, 44 and a ring member 46 which will be described later are also made in the above-described thickness and material.

According to the magnetic field generator 10 as described, even if an external impact for example, has caused an excessive load to the bonded portion of the permanent magnets 20, the flange-shaped member 34 holds the permanent magnets 20 on the space-facing surface 18a, and therefore it is possible to prevent separation of the permanent magnets 20 from adjacent permanent magnets 20 and the plate yokes 12a, 12b. By fixing the permanent magnets 20 with the flange-shaped member 34 as described above in addition to fixation with adhesive, it becomes possible to use the magnetic field generator 10 stably for an extended period of time.

Also, attaching the flange-shaped members 34 to the outer circumferential surfaces of the pole pieces 16a, 16b enables to use a permanent-magnet fixing member even if there is no space on the plate yokes 12a, 12b where the permanent magnet groups 14a, 14b are disposed.

Further, use of the flange-shaped member 34 enables assembly of the permanent-magnet fixing member to the magnetic field generator simpler (in a fewer steps) than in convention. Attaching the flange-shaped members 34 to the pole pieces 16a, 16b in advance will further reduce the number of assembling steps.

The attaching procedure of the flange-shaped member 34 may be as follows:

If the annular projections 26 in the pole pieces 16a, 16b are made of a plurality of annular projection pieces, the flange-shaped members 34 should be made in pieces correspondingly to each of the annular projection pieces; and after attaching each annular projection piece to its corresponding flange-shaped member piece, the annular projection pieces mounted with the flange-shaped member pieces are disposed on the base plate 22 in an annular shape.

As shown in FIG. 4, the flange-shaped member 34 may be formed not only to cover the space-facing surface 18a on the projection 18 in the permanent magnet group 14a, but also to extend onto the outer circumferential surface 18b or even to an upper surface of the plate yoke 12a. The same applies to arrangements for the permanent magnet group 14b.

Figure 5:
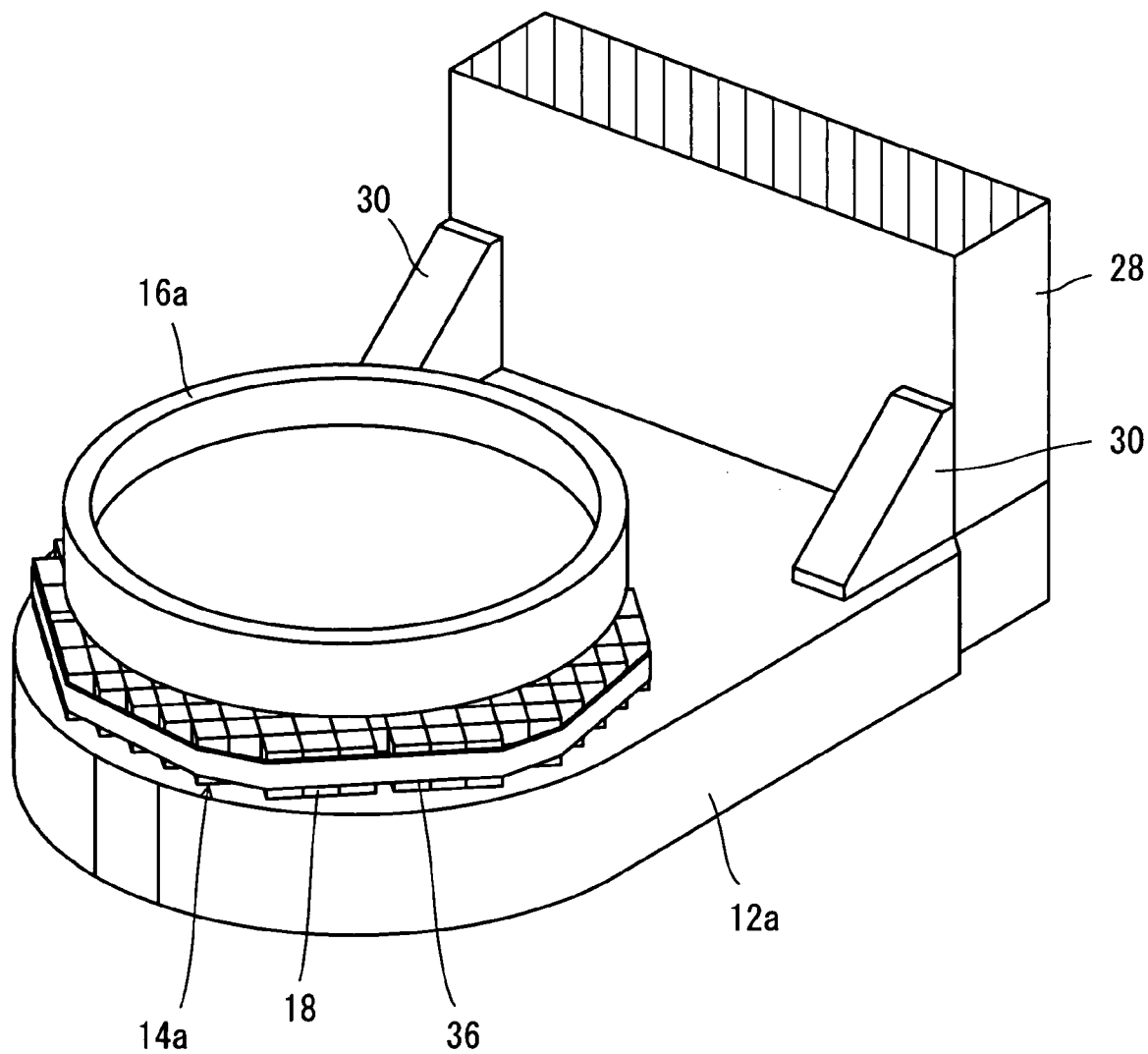
[FIG. 5] A partial perspective view showing an example embodiment provided with a belt-shaped member.

Next, as shown in FIG. 5, the permanent-magnet fixing member may be provided by a belt-shaped member 36.

The belt-shaped member 36 may be a flexible metal belt, preferably of a nonmagnetic metal such as stainless steel. Such a nonmagnetic metal has a superior strength, yet does not affect the magnetic field generated in the magnetic field generator 10. If eddy current prevention has a priority, use of non-metal material such as polyester fibers is preferred. For increased strength, glass fibers or carbon fibers may be added to the non-metal material. A preferred thickness of the belt-shaped member 36 is 0.1 mm through 1.0 mm, with a width being 90 mm, for example. Preferably, the member is wound around the outer circumferential surface 18b of the projection 18 a plurality of times in layers. Further, only one or a plurality of the belt-shaped members 36 may be used.

By winding the belt-shaped member 36 as the above, around the outer circumferential surface 18b of the projection 18, fixation of the permanent magnets 20 is enhanced.

Further, the belt-shaped member 36 can be attached easily to the outer circumferential surface 18b of the projection 18 in any magnetic field generator which has a projection 18 whose outer circumferential surface 18b is exposed.

Figure 6:
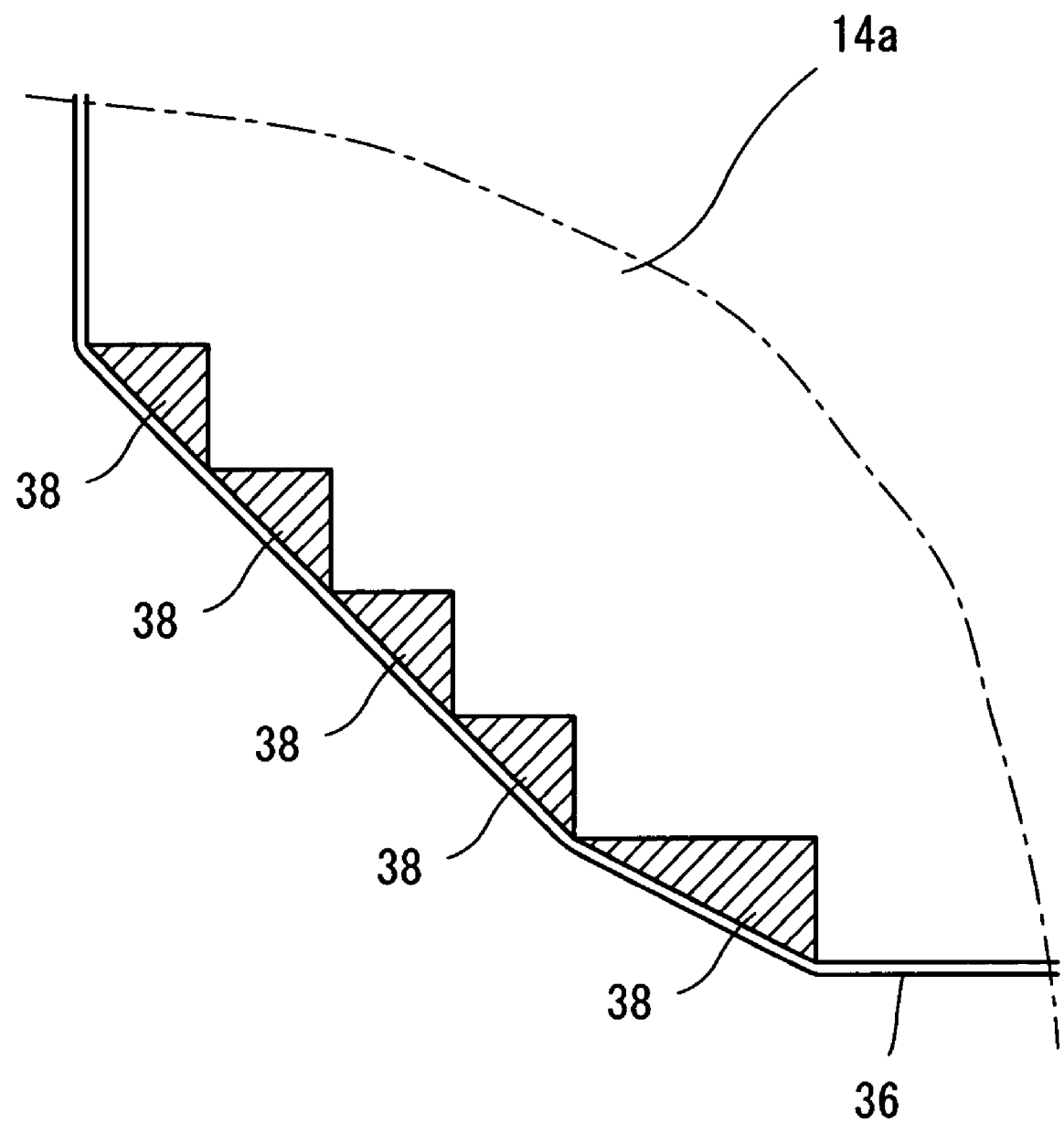
[FIG. 6] A schematic view showing a state where a reinforcing member is placed into a gap between the belt-shaped member and a projection.

If the outer circumferential surface 18b of the projection 18 has an uneven contour, fixing force of the belt-shaped member 36 may not reach all of the permanent magnets 20. Therefore, as shown in FIG. 6, reinforcing members 38 are placed between the belt-shaped member 36 and the permanent magnets 20 (permanent magnet group 14a), for strong fixation of all the permanent magnets 20 which constitute the outer circumferential portion 18b of the projection 18.

The reinforcing member 38 preferably has a shape to fill the gap between the belt-shaped member 36 and the permanent magnets 20 which constitute the projection 18; however, the shape may be discretional as long as the force of the belt-shaped member 36 is increased to hold the permanent magnets 20 which constitute the projection 18 of the permanent magnet group 14a.

Figure 7:
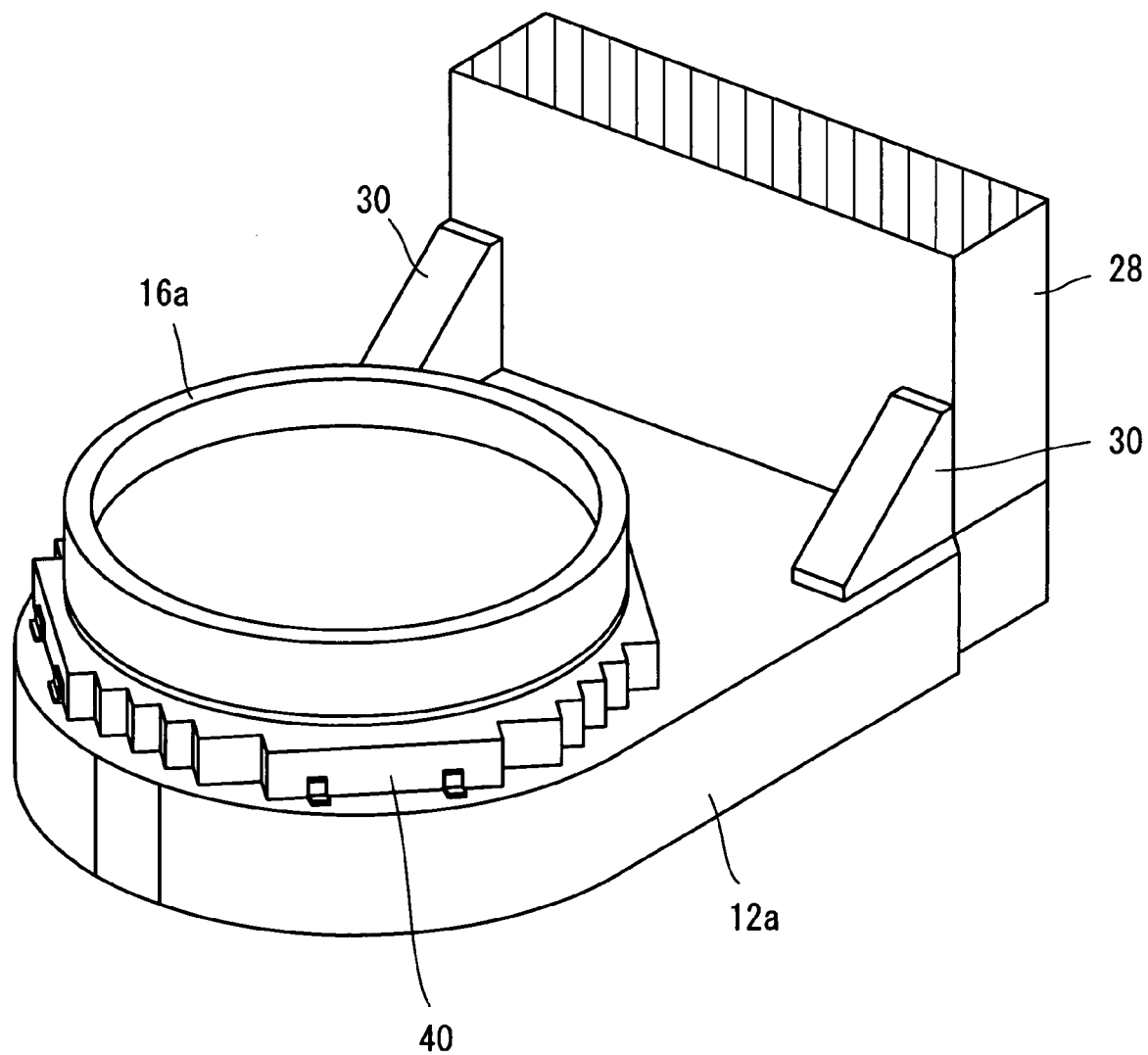
[FIG. 7] A partial perspective view showing an example embodiment provided with a cover member.

Further, as shown in FIG. 7, the permanent-magnet fixing member may be provided by a cover member 40. The cover member 40 has a shape following the projection 18. The cover member 40 is preferably fixed with screws for example, to the plate yoke 12a, and may be divided circumferentially into a plurality of pieces for assembling efficiency.

Use of the cover member 40 enables to fix all surfaces (space-facing surfaces 18a and outer circumferential surfaces 18b) of the permanent magnets 20 which constitute the projection 18.

Figure 8:
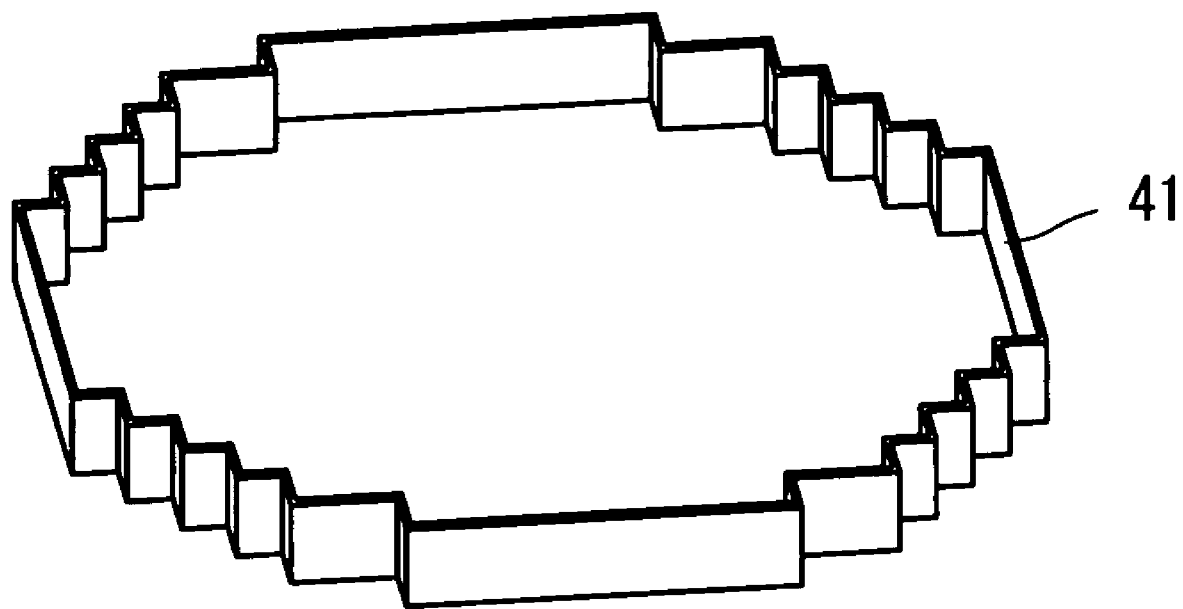
[FIG. 8] A perspective view showing a variation of the cover member.

Further, a cover member 41 as shown in FIG. 8 may be used. The cover member 41 is provided only on the outer circumferential surface 18b of the projection 18, along the outer circumferential surface 18b and completely around the outer circumferential surface 18b. The cover member 41 enables to fix the outer circumferential surfaces 18b of the permanent magnets 20 which constitute the projection 18.

The cover members 40, 41 can be manufactured more easily and are-effective when the projection 18 has a simpler shape. The cover members 40, 41 may be circumferentially divided into a plurality of pieces.

Figure 9:
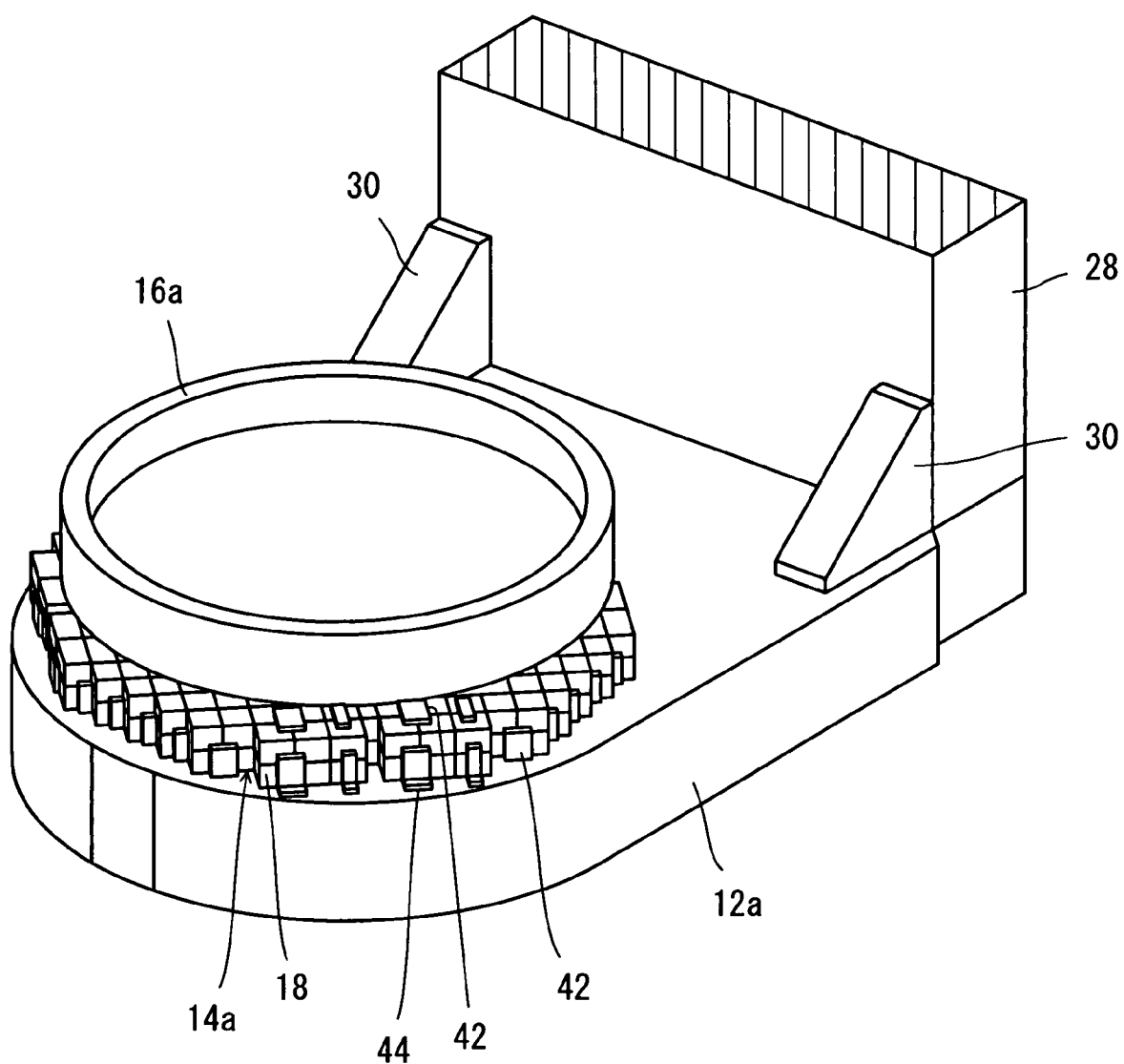
[FIG. 9] A partial perspective view showing an example embodiment provided with platy members.
Figure 10:
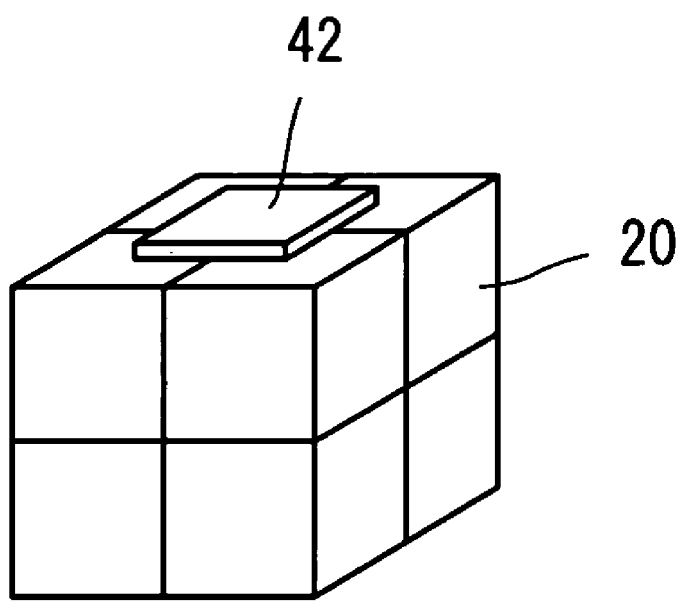
[FIG. 10] A schematic view for describing the platy members.
Figure 10:
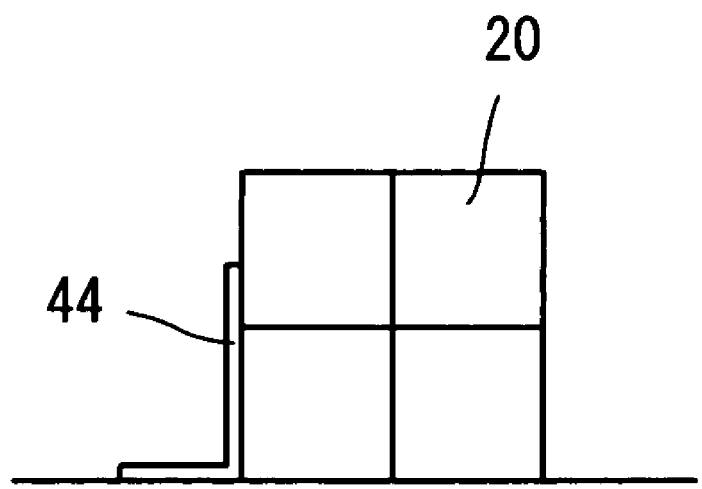

Further, as shown in FIG. 9 and FIG. 10(a), the permanent-magnet fixing member may be platy members 42 attached to the space-facing surface 18a or outer circumferential surface 18b of the projection 18 to connect a plurality of permanent magnets 20 with each other. Jointing a plurality of permanent magnets 20 together using the platy member 42 enables to prevent one of these permanent magnets 20 from coming off the adjacent permanent magnet 20. The size of platy member may be discretional; for example, the platy member may be formed annularly on the space-facing surface 18a of the projection 18 so as to make complete encirclement on the space-facing surface 18a.

Further, as shown in FIG. 9 and FIG. 10(b), a platy member 44 may have a shape of letter L, extending from the permanent magnets 20 to the upper surface of the plate yoke 12a. In this case, the permanent magnets 20 are fixed more strongly by fixing the platy member 44 to the plate yoke 12a, enabling to prevent separation of the permanent magnets 20 from the plate yoke 12a.

Further, the platy members 42, 44 as described can be attached easily to necessary places on the projection 18, enabling easy reinforcement in the fixation of the permanent magnets 20.

The same applies to arrangements for the magnetic pole unit 11b.

The flange-shaped member 34, the belt-shaped member 36, the reinforcing member 38, the cover members 40, 41, and the platy members 42, 44 described above are also applicable and can be used widely as means for reinforcing magnetic field generators which do not have protective means for preventing separation of the permanent magnets 20 from adjacent permanent magnets 20, plate yokes 12a, 12b or both.

Figure 11:
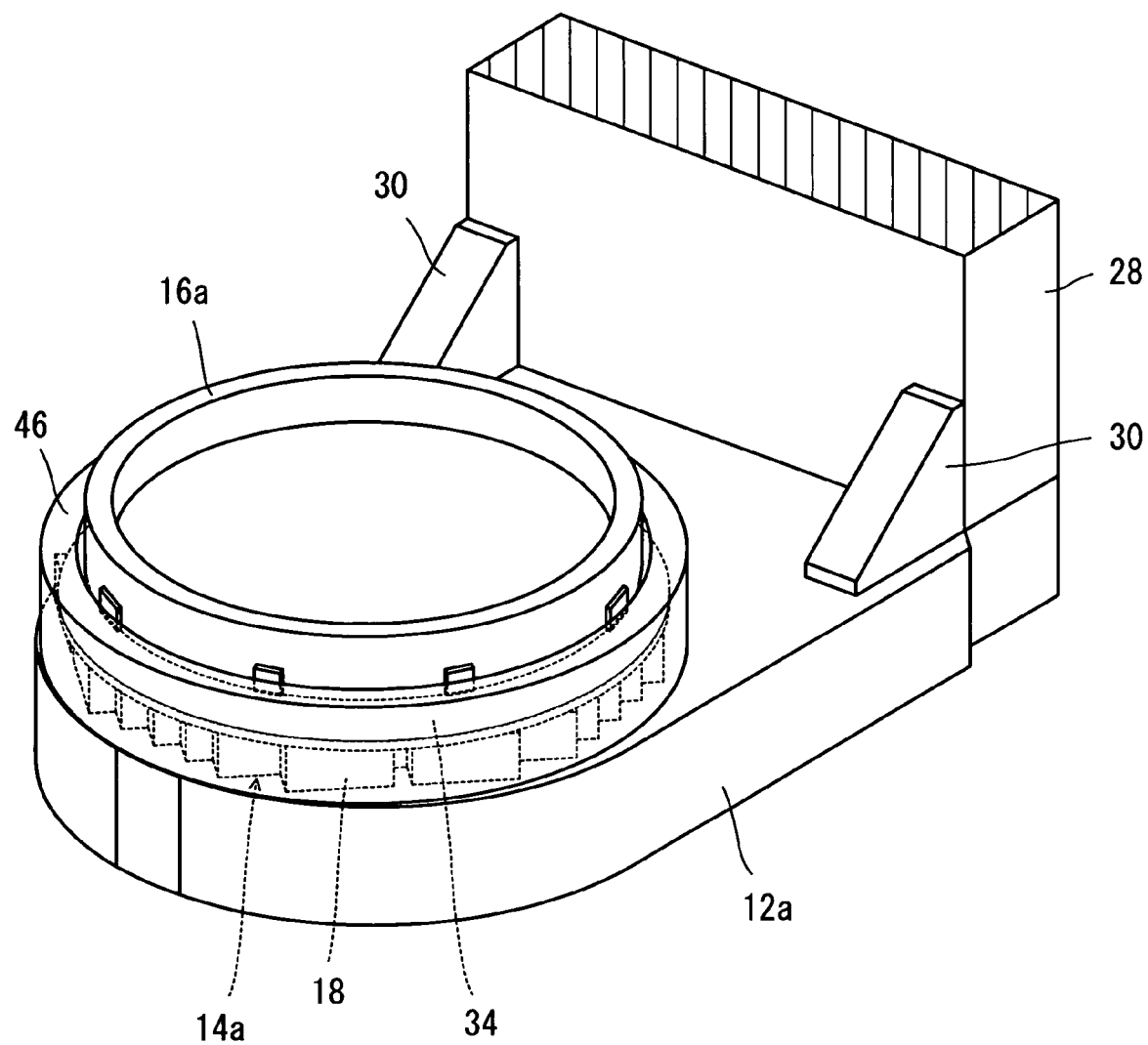
[FIG. 11] A partial perspective view showing an example embodiment provided with a ring member.

Further, as shown in FIG. 11 and FIG. 12(a), a ring member 46 may be disposed to cover the projection 18 which is provided with a flange-shaped member 34.

Use of the ring member 46 as described enables to prevent dropout of the permanent magnets 20 from the magnetic field generator 10, and to protect the permanent magnet group 14a from outside. The ring member 46 may be divided circumferentially into a plurality of pieces for assembling efficiency, etc.

In addition, a formed material 48 may be filled into the ring member 46 as shown in FIG. 12(b). This further enhances the force for holding the permanent magnets 20 which constitute the projection 18 in the permanent magnet group 14a.

The same applies to the arrangement for the magnetic pole unit 11b.

It should be noted here that the formed material 48 must be of a setting temperature not higher than 100° C. in consideration of thermal demagnetization of the permanent magnets 20. More preferably, the setting temperature should be not higher than 60° C. Urethane foam is a preferred material, for it sets at a room temperature, provides superior operability and economy, as well as applicability to existing magnetic field generators for reinforcement purposes.

Figure 12:
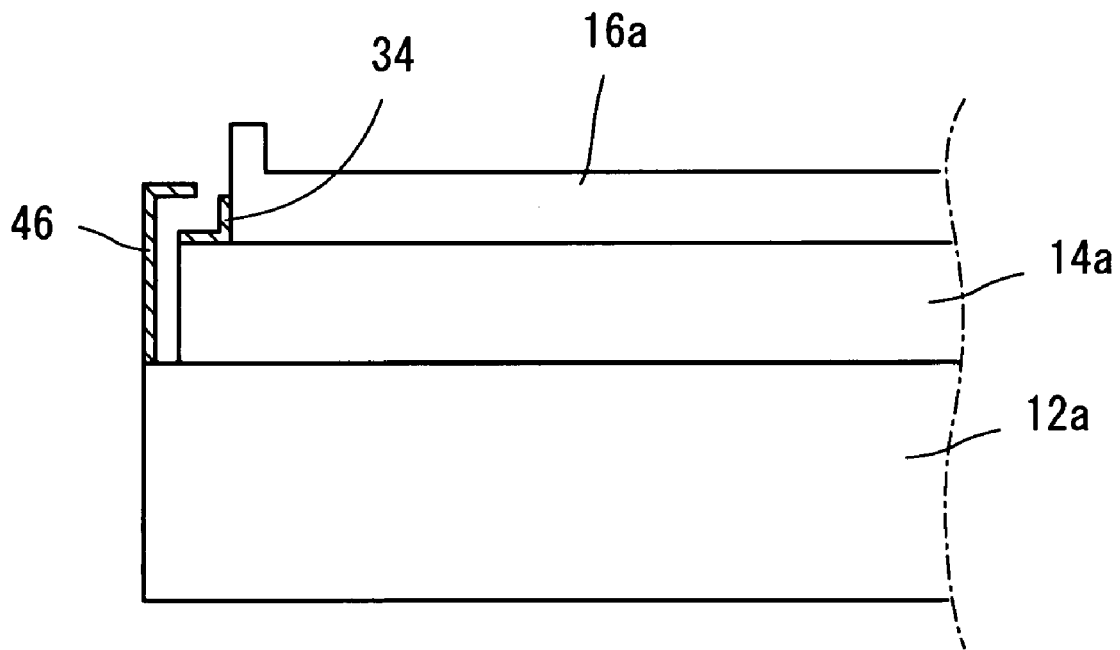
[FIG. 12]
Figure 12:
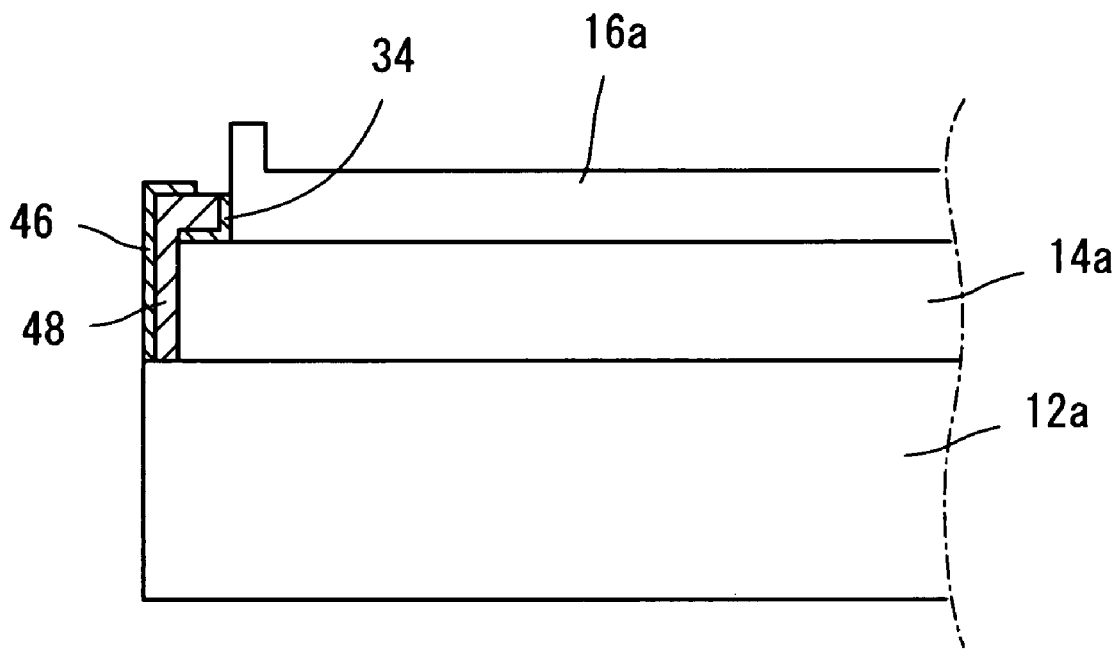

Obviously, the ring member 46 and the formed material 48 in FIG. 11 and FIG. 12 can be applied to embodiments which use the belt-shaped member 36, the reinforcing member 38 or the platy members 42, 44.

In all of the above embodiments, description was made for a case where yokes are provided by a pair of plate yokes 12a, 12b and a support yoke 28; however, the present invention is not limited to this. For example, a pair of permanent magnet groups 14a, 14b may be magnetically connected by an integral C-shaped yoke.

The present invention being thus far described and illustrated in detail, it is obvious that these description and drawings only represent examples of the present invention, and should not be interpreted as limiting the invention. The spirit and scope of the present invention is only limited by words used in the accompanied claims.

The invention claimed is:

1. A magnetic field generator for MRI, comprising:
a pair of permanent magnet groups opposed to each other with a space in between, each group including a plurality of permanent magnets bonded to each other;
a yoke for magnetically connecting the pair of permanent magnet groups; and
a pair of pole pieces provided on respective main surfaces of the permanent magnet groups;
the permanent magnet group having a projection extending more outward than an area of contact with the pole piece, a magnetic field being generated in a space between the pole pieces,
characterized by a permanent-magnet fixing member for preventing separation of the permanent magnets from the permanent magnet group, the permanent-magnet fixing member being formed along an outer circumferential side surface of the projection of the permanent magnet group wherein the permanent-magnet fixing member is provided by a belt-shaped member attached to the outer circumferential side surface of the projection, and a reinforcing member is provided between the belt-shaped member and the projection.

2. The magnetic field generator for MRI according to claim 1, wherein the permanent-magnet fixing member is provided by a flange-shaped member attached to an outer circumferential surface of the pole piece as to cover the outer circumferential side surface of the projection.

3. The magnetic field generator for MRI according to claim 1, wherein the permanent-magnet fixing member is provided by a platy member for connecting a plurality of permanent magnets which constitute the projection.

4. The magnetic field generator for MRI according to claim 3, wherein the platy member extends to the yoke and is fixed thereto.

5. A magnetic field generator for MRI, comprising:
a pair of permanent magnet groups opposed to each other with a space in between, each group including a plurality of permanent magnets bonded to each other;
a yoke for magnetically connecting the pair of permanent magnet groups; and
a pair of pole pieces provided on respective main surfaces of the permanent magnet groups;
the permanent magnet group having a projection extending more outward than an area of contact with the pole piece, a magnetic field being generated in a space between the pole pieces,
characterized by a permanent-magnet fixing member for preventing separation of the permanent magnets from the permanent magnet group, the permanent-magnet fixing member being formed along an outer circumferential side surface of the projection of the permanent magnet group,
wherein the magnetic field generator further comprises a ring member surrounding the projection provided with the permanent-magnet fixing member, and a formed material filled in a space between the ring member and the projection.

6. A magnetic field generator for MRI, comprising:
a pair of permanent magnet groups opposed to each other with a space in between, each group including a plurality of permanent magnets bonded to each other; a yoke for magnetically connecting the pair of permanent magnet groups; and a pair of pole pieces provided on respective main surfaces of the permanent magnet groups; the permanent magnet group having a projection extending more outward than an area of contact with the pole piece, a magnetic field being generated in a space between the pole pieces, characterized by a permanent-magnet fixing member for preventing separation of the permanent magnets from the permanent magnet group, the permanent-magnet fixing member being formed along an outer circumferential side surface of the projection of the permanent magnet group, wherein the permanent-magnet fixing member is provided by a cover member which follows a shape of the projection.

* * * * *